（12） United States Patent
Lee et al.

(10) Patent No.: US 10,381,592 B2
(45) Date of Patent: Aug. 13, 2019

(54) DISPLAY APPARATUS INCLUDING OVERLAPPING CONDUCTIVE LINES

(71) Applicant: SAMSUNG DISPLAY CO., LTD., Yongin-si, Gyeonggi-Do (KR)

(72) Inventors: Wonse Lee, Yongin-si (KR); Ae Shin, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 16/151,832

(22) Filed: Oct. 4, 2018

(65) Prior Publication Data

US 2019/0036065 A1 Jan. 31, 2019

Related U.S. Application Data

(62) Division of application No. 15/381,988, filed on Dec. 16, 2016, now Pat. No. 10,121,986.

(30) Foreign Application Priority Data

Jun. 16, 2016 (KR) .......................... 10-2016-0075102

(51) Int. Cl.
*H01L 51/52* (2006.01)
*H01L 27/32* (2006.01)

(52) U.S. Cl.
CPC ...... *H01L 51/5228* (2013.01); *H01L 27/3246* (2013.01); *H01L 27/3258* (2013.01); *H01L 27/3276* (2013.01)

(58) Field of Classification Search
CPC ............ H01L 51/5228; H01L 27/3258; H01L 27/3276

USPC ............................................ 257/40, E51.019
See application file for complete search history.

(56) References Cited

U.S. PATENT DOCUMENTS

| 8,030,838 B2 | 10/2011 | Kwak et al. |
| 8,436,376 B2 | 5/2013 | Bang et al. |
| 9,153,631 B2 | 10/2015 | Sung et al. |
| 9,209,227 B2 | 12/2015 | Ono et al. |
| 2008/0191603 A1 | 8/2008 | Kubota |
| 2011/0279433 A1 | 11/2011 | Ryu |
| 2012/0256973 A1 | 10/2012 | Choi et al. |

(Continued)

FOREIGN PATENT DOCUMENTS

| KR | 10-0784544 | 12/2007 |
| KR | 10-0875103 | 12/2008 |

(Continued)

*Primary Examiner* — Robert T Huber
(74) *Attorney, Agent, or Firm* — F. Chau & Associates, LLC

(57) ABSTRACT

A first conductive line is positioned outside a display area of a substrate. A passivation layer covers a portion of the first conductive line. A first connection line is positioned on the passivation layer, contacting the first conductive line. An insulation layer having at least one opening is positioned on the passivation layer and the first connection line. A second connection line is positioned on the insulation layer. The second connection line contacts the first connection line via the at least one opening and has an end portion that contacts the first conductive line. A second conductive line is positioned between the display area and the first conductive line, overlapping the first connection line and including a hole. The hole of the second conductive line overlaps one of the at least one opening. The passivation layer is interposed between the second conductive line and the first connection line.

7 Claims, 11 Drawing Sheets

(56) References Cited

U.S. PATENT DOCUMENTS

2015/0008400 A1 1/2015 Kim
2017/0365808 A1 12/2017 Lee et al.

FOREIGN PATENT DOCUMENTS

KR 10-2011-0135734 12/2011
KR 10-2015-0006125 1/2015

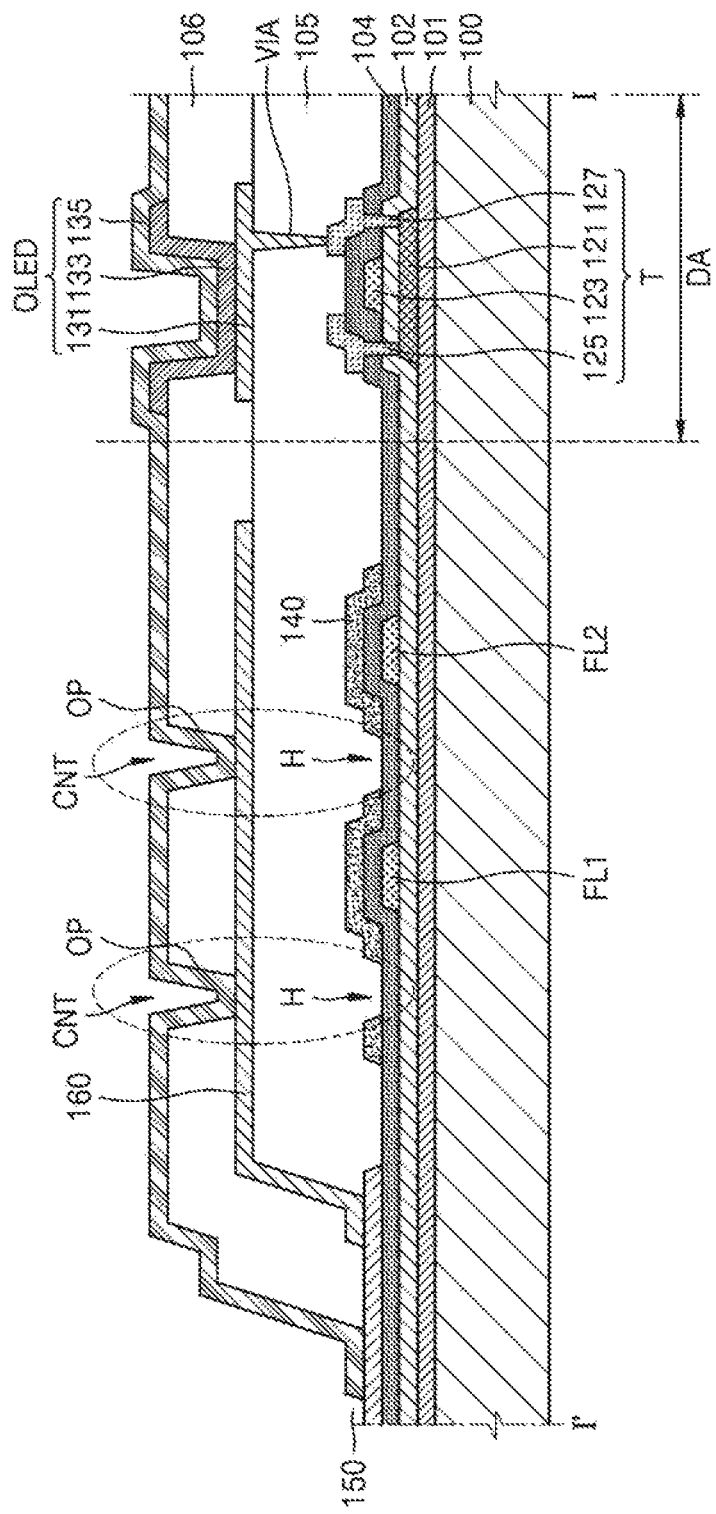

DISPLAY APPARATUS INCLUDING OVERLAPPING CONDUCTIVE LINES

CROSS-REFERENCE TO RELATED APPLICATION

This application is a divisional application of U.S. patent application Ser. No. 15/381,988 filed Dec. 16, 2016, which claims priority under 35 U.S.C. § 119 to Korean Patent Application No. 10-2016-0075102, filed on Jun. 16, 2016 in the Korean Intellectual Property Office, the disclosure of which is incorporated by reference herein in its entirety.

TECHNICAL FIELD

The present invention relates to a display apparatus.

DISCUSSION OF RELATED ART

Display apparatus include a display area that displays an image and an encapsulation member that encapsulates the lower substrate. The encapsulation member may be an encapsulation substrate or an encapsulation thin film.

When an external impact is applied to the display apparatus, a short circuit between wirings for supplying various signals to the display area may occur to cause defects on the image of the display area.

SUMMARY

According to an exemplary embodiment of the present invention, A display apparatus is provided as follows. A substrate includes a display area. A first conductive line is positioned outside the display area of the substrate. A passivation layer covers a portion of the first conductive line. A first connection line is positioned on the passivation layer. The first connection line is in contact with the first conductive line. An insulation layer is positioned on the passivation layer and the first connection line. The insulation layer includes at least one opening. A second connection line is positioned on the insulation layer. The second connection line is in contact with the first connection line via the at least one opening and has an end portion that contacts the first conductive line. A second conductive line is positioned between the display area and the first conductive line. The second conductive line overlaps the first connection line and includes a hole in a location corresponding to the at least one opening of the insulation layer so that the hole of the second conductive line overlaps one of the at least one opening of the insulation layer. The passivation layer is interposed between the second conductive line and the first connection line.

According to an exemplary embodiment of the present invention, a display apparatus having a display area is provided as follows. A first conductive line is positioned on an first interlayer insulation layer. A second conductive line is positioned on the first interlayer insulation layer. A passivation layer covers a portion of the first conductive line and the second conductive line. A first connection line is positioned on the passivation layer. The first connection line contacts a first region of the first conductive line. A pixel electrode is positioned on the passivation layer. An insulation layer is positioned on the passivation layer and the first connection line. The insulation layer covers an edge of the pixel electrode and includes at least one opening. An emission layer is positioned on the pixel electrode. A second connection line is positioned on the emission layer and the insulation layer. The second connection line contacts the first connection line via the at least one opening and contacting a second region of the first conductive line. The second region of the first conductive line is spaced apart from the first region of the first conductive line. The second conductive line overlaps the first connection line and comprises a hole in a location corresponding to the at least one opening of the insulation layer so that the hole of the second conductive line overlaps one of the at least one opening of the insulation layer.

According to an exemplary embodiment of the present invention, a display apparatus is provided as follows. A display area includes an organic light-emitting diode (OLED), a first driver, a second driver, a plurality of fanout lines connecting the first driver to the display area, a first conductive line, a second conductive line, a first connection line connected to a first region of the first conductive line, and a second connection line connected to a second region of the first conductive line, the first connection line and an electrode of the OLED. The plurality of fanout lines, the second conductive line, the first connection line and the second connection line overlap each other.

BRIEF DESCRIPTION OF DRAWINGS

These and other features of the present invention will become more apparent by describing in detail exemplary embodiments thereof with reference to the accompanying drawings of which:

FIG. 7 is a partial cross-sectional view taken along line I-I' of FIG. 1, according to an exemplary embodiment;

DETAILED DESCRIPTION OF EXEMPLARY EMBODIMENTS

Figure 1:
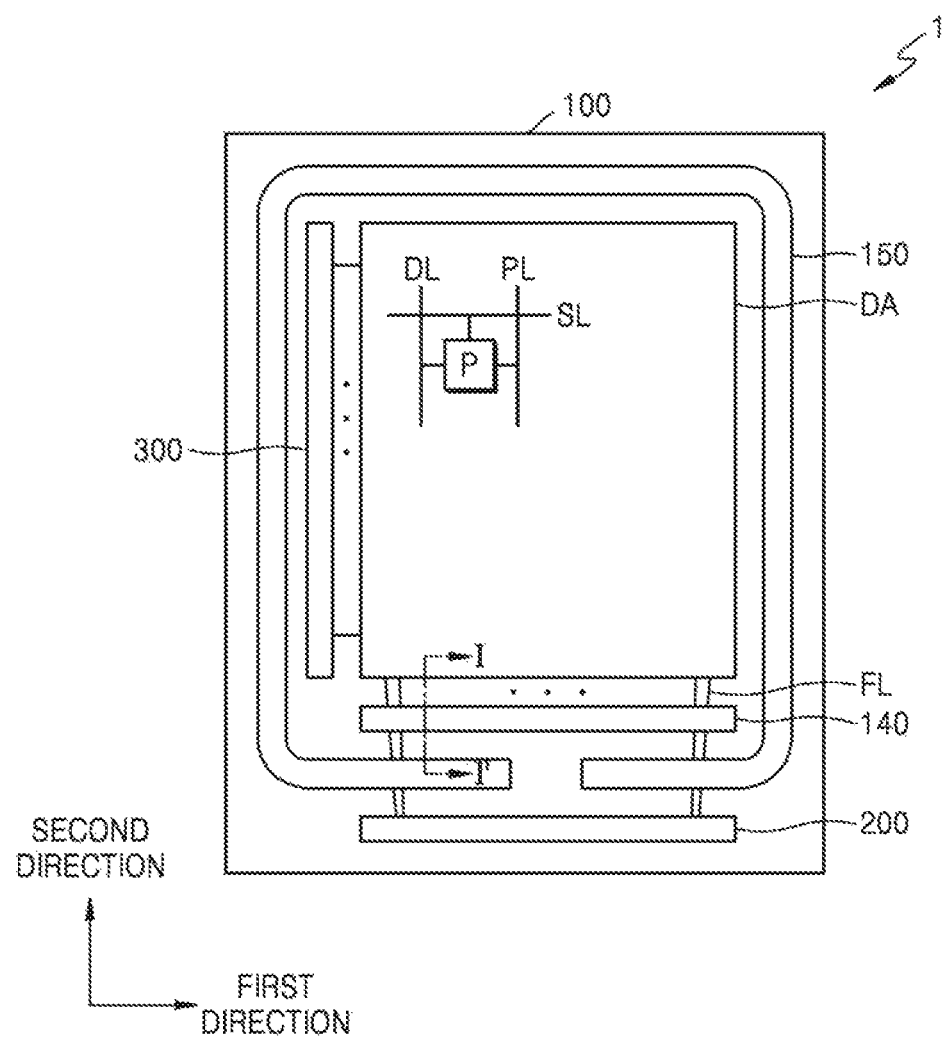
FIG. 1 is a schematic plan view of a display apparatus according to an exemplary embodiment.

Exemplary embodiments of the present invention will be described below in detail with reference to the accompanying drawings. However, the present invention may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

Figure 2:
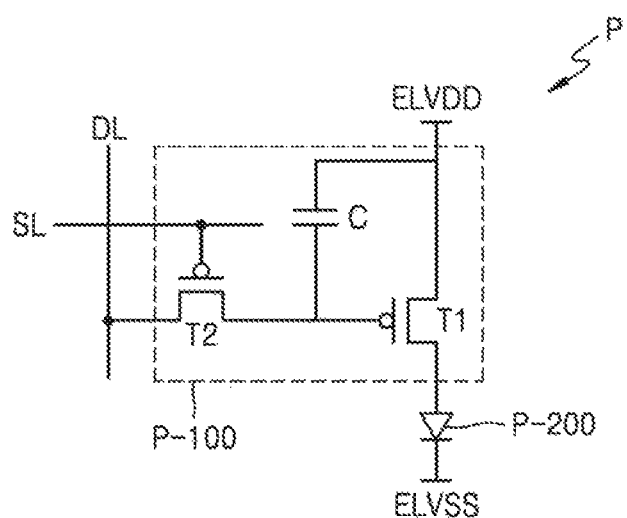
FIG. 2 is a circuit diagram of a pixel of FIG. 1.

FIG. 1 is a schematic plan view of a display apparatus 1 according to an exemplary embodiment. FIG. 2 is a circuit diagram of a pixel P of FIG. 1.

Referring to FIG. 1, the display apparatus 1 may include a substrate 100 that has a display area DA. A plurality of scan lines SL, a plurality of data lines DL, and a plurality of power lines PL may be arranged in the display area DA of the substrate 100. The plurality of scan lines SL are separated from each other in a second direction, and each of the scan lines SL extends in a first direction and transmits a scan signal to a pixel. The plurality of data lines DL are separated from each other in the first direction, and each of the data lines DL extends in the second direction and transmits a data signal to the pixel. The plurality of power lines PL may be parallel to the scan lines SL and/or the data lines DL and may be implemented in a grid or mesh form. Each of the power lines PL transmits a first power voltage ELVDD to the pixel.

A plurality of pixels P may each be connected to a corresponding scan line SL, a corresponding data line DL, and a corresponding power line PL. The plurality of pixels P may be arranged in a matrix form in the first direction and the second direction perpendicular to the first direction, on the substrate 100. However, the present invention is not limited thereto. For example, the pixels P in the first direction and/or the second direction may be arranged in various patterns such as a zigzag. Each pixel P emits one color and for example, may emit one of red, blue, green, and white. However, the present invention is not limited thereto. For example, each pixel P may emit another color other than red, blue, green, and white.

Referring to FIG. 2, a pixel P may include a pixel circuit P-100 and a light-emitting diode P-200 that is connected to the pixel circuit P-100 and emits light. The light-emitting diode may be an organic light-emitting diode (OLED) P-200 that includes a pixel electrode, an opposite electrode facing the pixel electrode, and an emission layer between the pixel electrode and the opposite electrode. A second power voltage ELVSS is applied to the opposite electrode of the OLED P-200. One of the pixel electrode and the opposite electrode of the OLED P-200 may be a common electrode that is formed entirely over the display area DA.

The pixel circuit P-100 of FIG. 2 includes two thin film transistors T1 and T2 and one capacitor C. A first electrode of a first thin film transistor T1 receives the first power voltage ELVDD from the power line PL (FIG. 1), and a second electrode of the first thin film transistor T1 is connected to a first electrode of the OLED P-200. A gate electrode of the first thin film transistor T1 is connected to a second electrode of a second thin film transistor T2. A gate electrode of the second thin film transistor T2 is connected to the scan line SL, and a first electrode of the second thin film transistor T2 is connected to the data line DL. A first electrode of the capacitor C is connected to the gate electrode of the first thin film transistor T1, and a second electrode of the capacitor C receives the first power voltage ELVDD from the power line PL. The second power voltage ELVSS may be lower than the first power voltage ELVDD.

FIG. 2 illustrates the pixel circuit P-100 including two thin film transistors T1 and T2 and one capacitor C for one pixel P. However, the present invention is not limited thereto. For example, the one pixel P may include two or more thin film transistors and one or more capacitors and thus may have various pixel circuits further including separate wirings.

A driver and a plurality of conductive lines may be arranged around the display area DA, that is, outside the display area DA.

For example, the driver may include a first driver 200 and a second driver 300, as shown in FIG. 1.

The first driver 200 may generate data signals and may send the data signals to the data lines DL arranged in the display area DA via fanout lines FL. The fanout lines FL may each have one end connected to a corresponding data line DL and the other end connected to the first driver 200. The first driver 200, which is a driving circuit such as a shift register, a level shifter, a video line, a switch, and the like, may be formed as an integrated circuit chip and mounted on the substrate 100.

The second driver 300 may generate scan signals and may send the scan signals to the scan lines SL arranged in the display area DA. The second driver 300, which is a driving circuit including a shift register and a level shifter that are implemented as a plurality of transistors and capacitors, may be directly formed on the substrate 100 when the pixels P in the display area DA are formed. For example, the second driver 300 may be formed using a fabrication process for forming the display area DA.

For example, the plurality of conductive lines may include a first power voltage line 140 that sends the first power voltage ELVDD to the pixels P or a second power voltage line 150 that sends the second power voltage ELVSS to the pixels P. The conductive lines may further include a plurality of signal lines that transmit an initialization signal, a driving signal, a clock signal, a control signal, and the like to the first and second drivers 200 and 300 and/or the pixels P.

For example, the plurality of conductive lines may include a first conductive line, which may be referred to as the second power voltage line 150, and a second conductive line, which may be referred to as the first power voltage line 140.

The first power voltage line 140 may be disposed around the display area DA, for example, at least one side of the substrate 100. The first power voltage line 140 extends in the first direction at a lower side of the substrate 100. The first power voltage line 140 may be electrically connected to the power lines PL arranged in the display area DA.

The second power voltage line 150 may be disposed around the display area DA, for example, at least one side of the substrate 100. The second power voltage line 150 extends surrounding the display area DA along left and right sides and an upper side of the substrate 100, starting from the lower side of the substrate 100. A thickness of the second power voltage line 150 may be uniform or may vary according to a side at which the second power voltage line 150 is disposed. The second power voltage line 150 may be electrically connected to the opposite electrode of the organic light-emitting device OLED.

The driver and the conductive lines may be connected to terminal parts (not shown) that are arranged on the edge of the substrate 100 and thus may receive electrical signals transmitted from the outside.

Figure 3:
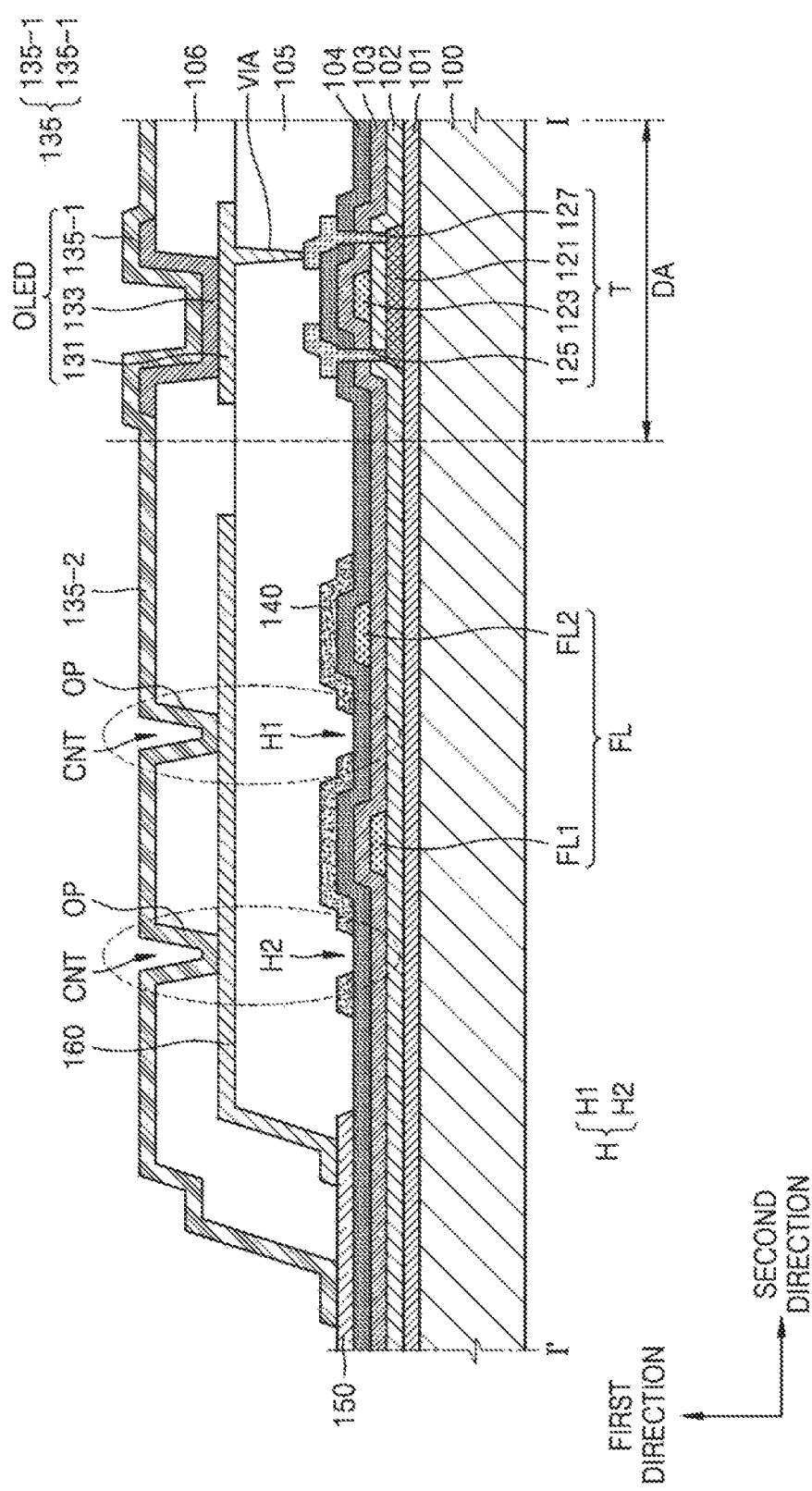
FIG. 3 is a partial cross-sectional view taken along line I-I' of FIG. 1.

FIG. 3 is a partial cross-sectional view taken along line I-I' of FIG. 1.

Referring to FIG. 3, a buffer layer 101 may be on the substrate 100.

The substrate 100 may include various materials, such as glass, metal, or plastic. According to an exemplary embodiment, the substrate 100 may flexible. The flexible substrate may be twisted or bent so that the substrate is allowed to be folded or rolled. The flexible substrate may include ultra-thin glass, metal, or plastic.

The buffer layer 101 may prevent intrusion of an impure element through the substrate 100, may planarize a surface of the substrate 100, and may include a layer or layers including an inorganic material such as silicon nitride (SiN$_x$) and/or silicon oxide (SiO$_x$). The present invention is not limited thereto. For example, the buffer layer 101 may be omitted.

A thin film transistor T may be in the display area DA of the substrate 100. The thin film transistor T may correspond to the first thin film transistor T1. The second thin film transistor T2 may also have the same structure as the first thin film transistor T1, as shown in FIG. 3.

A semiconductor layer may be formed on the buffer layer 101 with a semiconductor material, and the semiconductor layer may be patterned to form an active layer 121. The semiconductor material may be an inorganic semiconductor material such as amorphous silicon or polycrystalline silicon, an organic semiconductor material, or an oxide semiconductor material.

A gate insulation layer 102 that covers the active layer 121 may be on the substrate 100. The gate insulation layer 102 may be a layer or layers including an inorganic material. For example, the gate insulation layer 102 may include silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), and/or zinc oxide (ZrO$_2$).

A gate electrode 123 may be on the gate insulation layer 102. The gate electrode 123 may be connected to a scan line (not shown) that applies a scan signal to the thin film transistor T and may include a low-resistance metal material. For example, the gate electrode 123 may be a single layer or multiple layer including at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The gate electrode 123 may overlap at least a portion of the active layer 121.

In an exemplary embodiment, the active layer 121 may be doped with impurities, using the gate electrode 123 as a mask. Thus, the active layer 121 may include a source region and a drain region that are doped with impurities and a channel region between the source region and the drain region.

A second interlayer insulation layer 103 that covers the gate electrode 123 may be on the substrate 100. Like the gate insulation layer 102, the second interlayer insulation layer 103 may be a layer or layers including an inorganic material. For example, the second interlayer insulation layer 103 may include silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), and/or zinc oxide (ZrO$_2$).

A first interlayer insulation layer 104 that covers the second interlayer insulation layer 103 may be on the substrate 100. The first interlayer insulation layer 104 may be a layer or layers including an inorganic material. For example, the first interlayer insulation layer 104 may include silicon oxide (SiO$_2$), silicon nitride (SiN$_x$), silicon oxynitride (SiON), aluminum oxide (Al$_2$O$_3$), titanium oxide (TiO$_2$), tantalum oxide (Ta$_2$O$_5$), hafnium oxide (HfO$_2$), and/or zinc oxide (ZrO$_2$).

A source electrode 125 and a drain electrode 127 may be on the first interlayer insulation layer 104. The source electrode 125 and the drain electrode 127 may be a layer or layers including a conductive material that has high conductivity. For example, the source electrode 125 and the drain electrode 127 may include the same material as that of the gate electrode 123. The source electrode 125 and the drain electrode 127 may be respectively connected to the source region and the drain region of the active layer 121 via contact holes formed in the gate insulation layer 102, the second interlayer insulation layer 103, and the first interlayer insulation layer 104.

At the outside of the display area DA of the substrate 100, the first power voltage line 140 and the second power voltage line 150 may be arranged on the first interlayer insulation layer 104. In an exemplary embodiment, the first power voltage line 140, the second power voltage line 150, the source electrode 125 and the drain electrode 127 may have the same material. The first power voltage line 140 may be between the display area DA and the second power voltage line 150 and may be closer to the display area DA than the second power voltage line 150.

In an exemplary embodiment, the first power voltage line 140, the second power voltage line 150, and the gate electrode 123 of the thin film transistor T may be formed on a same layer. For example, the first power voltage line 140 and the second power voltage line 150 may be formed on a top surface of the first interlayer insulation layer 104; and the gate electrode 123 may be formed on a bottom surface of the first interlayer insulation layer 104. In an exemplary embodiment, the first power voltage line 140, the second power voltage line 150, and the gate electrode 123 of the thin film transistor T may include a same material.

In an exemplary embodiment, the first power voltage line 140 and the second power voltage line 150 may be formed without having location relationships with the electrodes of the thin film transistor T. In an exemplary embodiment, the first power voltage line 140 and the second power voltage line 150 may be on different layers from each other. In an exemplary embodiment, the first power voltage line 140 and the second power voltage line 150 having different materials from each other may be on a same layer or different layers.

The first power voltage line 140 may include at least one hole H including a first hole H1 and a second hole H2. The hole H may be formed in a location that corresponds to a contact portion CNT where an opposite electrode 135 contacts an auxiliary electrode 160. In an exemplary embodiment, the hole H may be further formed in a location that does not correspond to the contact portion CNT, as shown in FIG. 6B, for example. The second hole H2 between two adjacent fanout lines FL may be symmetric, and an width of the second hole H2 may increase upwardly. The fanout lines FL will be described in detail below. The first hole H1 may be positioned between the 150 and a first fanout FL1 and may be asymmetric. The auxiliary electrode 160 may be referred to as a first connection line.

The fanout lines FL may be positioned under the first power voltage line 140. the fanout lines FL may formed under the first power voltage line 140 so that the fanout lines FL and the first power voltage line 140 overlap. The fanout lines FL may include a first fanout line FL1 and a second fanout line FL2. In an exemplary embodiment, the fanout lines FL and the gate electrode 123 may include a same material. The first fanout line FL1 may be on the gate insulation layer 102, and the second fanout line FL2 may be on the second interlayer insulation layer 103. In an exemplary embodiment, the first fanout line FL1 may be formed on a bottom surface of the second interlayer insulation layer 103 and the second fanout line FL2 may be formed on a top surface of the second interlayer insulation layer 103.

As the first fanout line FL1 and the second fanout line FL2 are arranged on different layers 102 and 103, respectively, from each other, a distance (interval) along the second direction between neighboring fanout lines located on different layers from each other may be decreased. Thus, a number of fanout lines FL formed at different height from the substrate 100 may increase in a unit area, and further, a short circuit between the fanout lines FL may be prevented.

A passivation layer 105 that completely covers the thin film transistor T and the first power voltage line 140 and covers a portion of the second power voltage line 150 (for example, an end portion of the second power voltage line 150) may be on the substrate 100. The passivation layer 105 may be a layer or layers including an organic material. The passivation layer 105 may include a polymer including poly(methyl methacrylate (PMMA) or polystyrene (PS), a polymer derivative having a phenol group, an acrylic-based polymer, an imide-based polymer, an aryl ether-based polymer, an amide-based polymer, a fluorine-based polymer, a p-xylene based polymer, a vinyl alcohol-based polymer, and a blend thereof. For example, the passivation layer 105 may include polyimide, polyamide, acrylic resin, etc.

A pixel electrode 131 of the organic light-emitting device OLED may be on the passivation layer 105 in the display area DA, and the auxiliary electrode 160 overlapping the first power voltage line 140 may be at the outside of the display area DA.

The pixel electrode 131 may be electrically connected to the drain electrode 127 of the thin film transistor T, exposed by a via hole VIA formed in the passivation layer 105. The pixel electrode 131 may be a reflective layer including a reflective conductive material such as silver (Ag), magnesium (Mg), aluminum (Al), platinum (Pt), lead (Pd), gold (Au), nickel (Ni), neodymium (Nd), iridium (Ir), chromium (Cr), and a compound thereof. In an exemplary embodiment, the pixel electrode 131 may be a transparent conductive oxide layer including a transparent conductive oxide material such as indium tin oxide (ITO), indium zinc oxide (IZO), zinc oxide (ZnO), indium oxide ($In_2O_3$), indium gallium oxide (IGO), or aluminum zinc oxide (AZO). In an exemplary embodiment, the pixel electrode 131 may have a stacked structure including the reflective layer and the transparent conductive oxide layer.

In an exemplary embodiment, the auxiliary electrode 160 and the pixel electrode 131 may be formed of a same material.

The auxiliary electrode 160 may be on the passivation layer 105 and include the same material as that of the pixel electrode 131. The auxiliary electrode 160 may contact a portion of the second power voltage line 150. The auxiliary electrode 160 may contact a portion of the top surface of the second power voltage line 150.

An insulation layer 106 may be on the passivation layer 105 and the auxiliary electrode 160. The insulation layer 106 may cover an edge of the pixel electrode 131 and may cover the passivation layer 105 and the auxiliary electrode 160. The insulation layer 106 may cover a portion of the second power voltage line 150. The insulation layer 106 may include at least one opening OP at the outside of the display area DA.

An organic layer 133 that includes an emission layer may be on the pixel electrode 131. The emission layer may include a low molecular organic material or a high molecular organic material. According to a type of the emission layer, the organic light-emitting device OLED may emit red light, green light, or blue light. However, the present invention is not limited thereto. For example, a plurality of organic emission layers may be arranged in one organic light-emitting device OLED. For example, a plurality of organic emission layers that emit red light, green light, and blue light may be vertically stacked on one another or mixed to emit white light. In this case, a color converting layer that coverts the emitted white light into predetermined color or a color filter may be further provided. The above-described red, green and blue colors are examples, and a combination of colors for emitting white light is not limited thereto.

Although not illustrated, at least one functional layer from among a hole injection layer, a hole transport layer, an electron transport layer, and an electron injection layer may be further disposed between the pixel electrode 131 and the emission layer and/or between the emission layer and the opposite electrode 135. According to an exemplary embodiment, one or more other functional layers may be further disposed between the pixel electrode 131 and the opposite electrode 135, in addition to the above-described layers. The functional layer may be formed also on the insulation layer 106, as a common layer to a plurality of organic light-emitting devices OLED of a plurality of pixels, by using an open mask. In this case, the functional layer that is formed on the insulation layer 106 at the outside of the display area DA may be removed therefrom.

The opposite electrode 135 that covers the display area DA as a common electrode may be on the organic layer 133 and the insulation layer 106. The opposite electrode 135 may extend to the outside of the display area DA and contact the second power voltage line 150. As illustrated in FIG. 1, the opposite electrode 135 may contact at least one side of the second power voltage line 150 surrounding the display area DA. The opposite electrode 135 may receive the second power voltage ELVSS from the second power voltage line 150. The opposite electrode 135 may contact the auxiliary electrode 160 via the opening OP of the insulation layer 106, which is formed in the contact portion CNT. The opposite electrode 135 may overlap the first power voltage line 140 and the auxiliary electrode 160 under the opposite electrode 135.

In an exemplary embodiment, the opposite electrode 135 may include a first portion 135-1 positioned within the display area DA. The first portion 135-1 of the opposite electrode 135 may be referred to as the common electrode. The opposite electrode 135 may include a second portion 135-2 positioned outside the display area DA. The second portion 135-2 of the opposite electrode 135 may be referred to as a second connection line. In an exemplary embodiment, the second connection line 135-2 may overlap the first power voltage line 140 and the auxiliary electrode 160. For example, the first power voltage line 140, the auxiliary electrode 160 and the second connection line 135-2 may be stacked vertically in the listed order.

The opposite electrode 135 may include one or more conductive materials. For example, the opposite electrode 135 may include a semi-transparent reflective layer including lithium (Li), calcium (Ca), lithium fluoride (LiF), aluminum (Al), magnesium (Mg), or silver (Ag). The present invention is not limited thereto. For example, the opposite electrode 135 may include light-transmissive metal oxide such as ITO, IZO, or ZnO. In an exemplary embodiment, the opposite electrode 135 may be formed of a single layer or two or more layers formed of different materials.

The substrate 100 may be encapsulated by an encapsulation member. The encapsulation member may be an encapsulation substrate that combines with the substrate 100 using a sealing material, or a thin film encapsulation layer having a structure including an inorganic material and an organic material alternately formed on the substrate 100. The thin film encapsulation layer may encapsulate the organic light-emitting device OLED to prevent exposure of the organic light-emitting device OLED to external air or foreign materials and due to its very small thickness, may be used for encapsulation in a flexible display apparatus that is bendable or foldable.

As the second power voltage line 150 and the opposite electrode 135 contact the auxiliary electrode 160, a voltage drop in the second power voltage ELVSS that is transmitted from the second power voltage line 150 to the opposite electrode 135 may be decreased compared with a case where there is no auxiliary electrode 160.

There is possibility that when the top of the display apparatus 1 may be pressed due to external impact, a short circuit between the auxiliary electrode 160 and the first power voltage line 140 may occur. To prevent such short circuit between the auxiliary electrode 160 and the first power voltage line 140, the first power voltage line 140 may the hole H under the contact portion CNT.

According to an exemplary embodiment, occurrence of a short circuit between the auxiliary electrode 160 and the first power voltage line 140 may be decreased by decreasing an overlapping area between the auxiliary electrode 160 and the first power voltage line 140. For example, the overlapping area of the auxiliary electrode 160 and the first power voltage line 140 may be decreased by forming the auxiliary electrode 160 as a bridge electrode. In an exemplary embodiment, the overlapping area of the auxiliary electrode 160 and the first power voltage line 140 may be decreased by forming the hole H of the first power voltage line 140 in a location corresponding to the contact portion CNT of a bridge electrode. In an exemplary embodiment, the overlapping area of the auxiliary electrode 160 and the first power voltage line 140 may be decreased by forming the auxiliary electrode 160 as a bridge electrode and forming the hole H of the first power voltage line 140 in a location corresponding to the contact portion CNT of the bridge electrode.

The bridge electrode of the auxiliary electrode 160 will be described with reference to FIGS. 4B and 4C.

In an exemplary embodiment, the second power voltage line 150 may include a first region 150-1 which is in contact with the auxiliary electrode 160. The second power voltage line 150 may further include a second region 150-2 which is in contact with the second connection line 135-2.

Figure 4A:
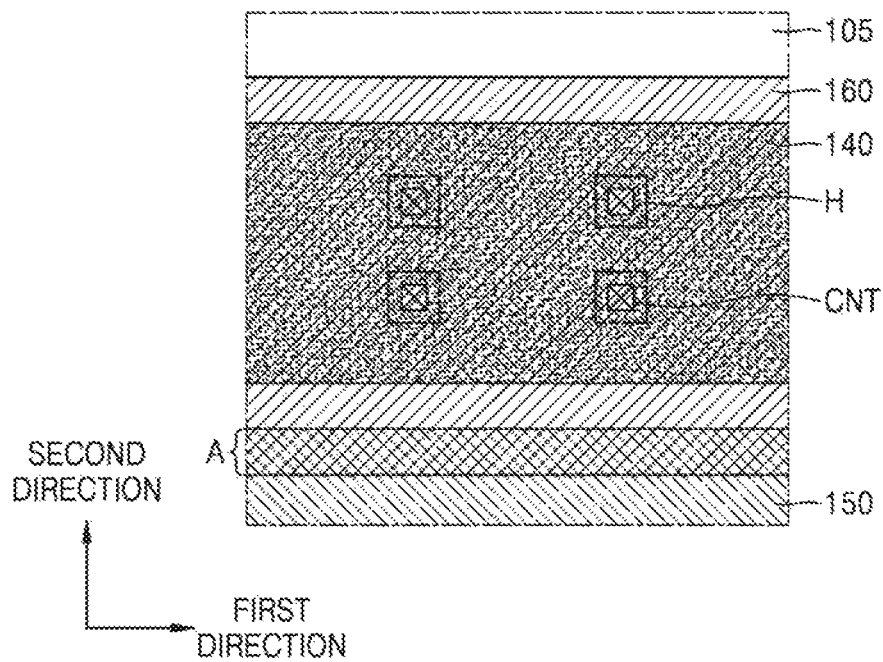
FIGS. 4A to 4C are plan views of various examples of an auxiliary electrode according to an exemplary embodiment.
Figure 4B:
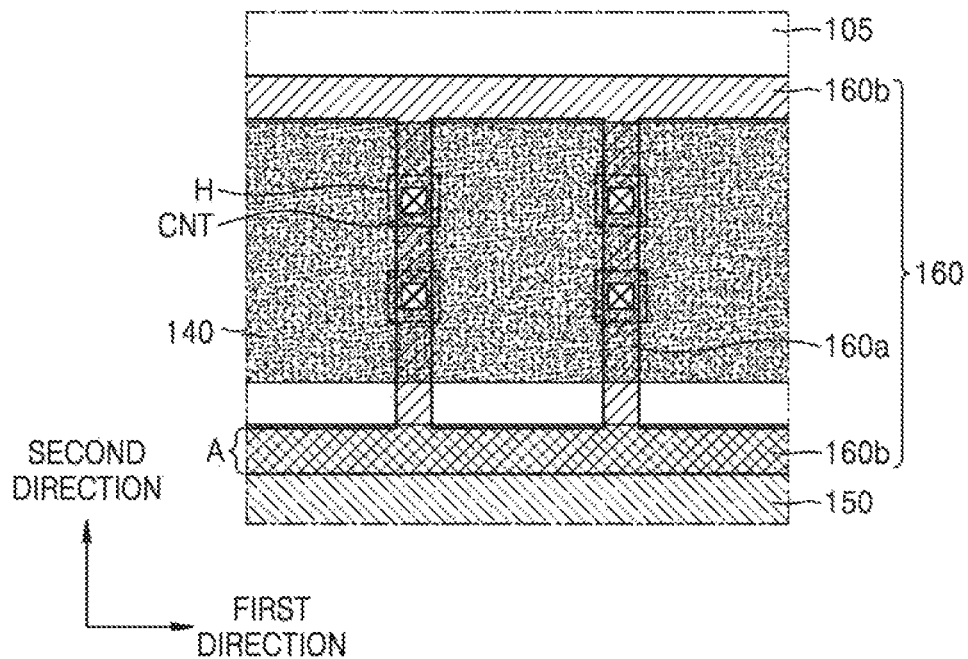
Figure 4C:
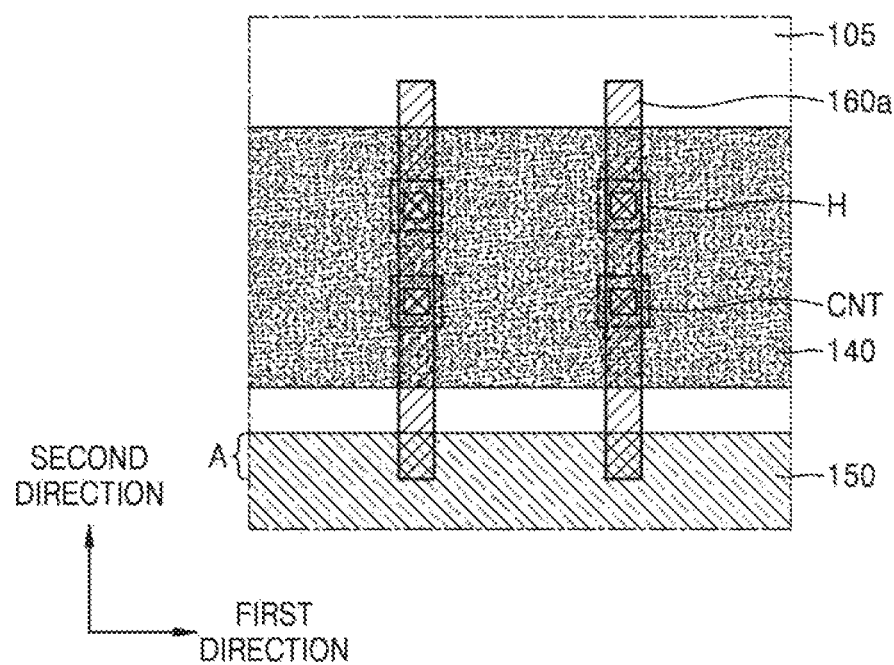

FIGS. 4A to 4C are plan views of various examples of the auxiliary electrode 160 according to an exemplary embodiment. For the convenience of description, the insulation layer 106 and the second connection line 135-2 will be omitted from FIGS. 4A to 4C.

Referring to FIG. 4A, on the first interlayer insulation layer 104 (FIG. 3) at a surrounding side of the display area DA, the first power voltage line 140 and the second power voltage line 150 may each extend in the first direction and be separated from each other by a predetermined distance. A plurality of holes H that have a predetermined pattern may be formed in the first power voltage line 140. The auxiliary electrode 160 extending in the first direction may be formed on the first power voltage line 140.

The auxiliary electrode 160 may contact the opposite electrode 135 in the contact portion CNT. A location of the hole H in the first power voltage line 140 may at least correspond to the contact portion CNT. A size of the hole H may be larger than that of the contact portion CNT. The size of the contact portion CNT may be a size of the opening OP (FIG. 3) formed in the insulation layer 106 (FIG. 3) on the auxiliary electrode 160 to partially expose the auxiliary electrode 160. The auxiliary electrode 160 may overlap entirely the first power voltage line 140 with the passivation layer 105 (FIG. 3) therebetween. A side of the auxiliary electrode 160 may contact the top surface of the passivation layer 105, and the other side may contact a portion (area A) of the second power voltage line 150.

Exemplary embodiments of FIGS. 4B and 4C are different from the embodiment of FIG. 4A in an overlapping area of the auxiliary electrode 160 and the first power voltage line 140.

Referring to FIG. 4B, the auxiliary electrode 160 may include a plurality of first sub-electrodes 160a arranged in parallel in the first direction, and a pair of second sub-electrodes 160b that connect end portions of the plurality of first sub-electrodes 160a to each other. The first sub-electrodes 160a may extend in the second direction, and the second sub-electrodes 160b may extend in the first direction.

The first sub-electrodes 160a may overlap the first power voltage line 140 with the passivation layer 105 (FIG. 3) therebetween. The first sub-electrodes 160a may contact the second connection line 135-2 in the contact portion CNT. A location of the hole H in the first power voltage line 140 may at least correspond to the contact portion CNT. A size of the hole H may be larger than that of the contact portion CNT. The size of the contact portion CNT may be a size of the opening OP (FIG. 3) formed in the insulation layer 106 (FIG. 3) on the first sub-electrodes 160a to partially expose the first sub-electrodes 160a.

Each of the pair of second sub-electrodes 160b may electrically connect ends of the first sub-electrodes 160a separated from each other by a predetermined distance to each other. For example, the first sub-electrodes 160a may be a bridge electrode that electrically connects the pair of second sub-electrodes 160b to each other. One of the pair of second sub-electrodes 160b may contact the top surface of the passivation layer 105, and the other may contact a portion (area A) of the second power voltage line 150. Areas of the pair of second sub-electrodes 160b may be different from each other.

In an exemplary embodiment, the second sub-electrode 160b that contacts the top surface of the passivation layer 105 may be omitted, and only the second sub-electrode 160b that contacts the portion (area A) of the second power voltage line 150 may be provided. In this case, the end portions of the first sub-electrodes 160a may contact the top surface of the passivation layer 105. For example, the first sub-electrodes 160a may be implemented as comb electrodes, and the one second sub-electrode 160b that contacts the second power voltage line 150 may electrically connect ends of the comb electrodes to each other.

FIG. 4C shows an auxiliary electrode 160 without including the pair of second sub-electrodes 160b of FIGS. 4A and 4B. For example, FIG. 4C shows the auxiliary electrode 160 a plurality of first sub-electrodes 160a separated from each other by a predetermined distance. One end of each of the first sub-electrodes 160a may contact the top surface of the passivation layer 105, and the other end may contact a portion (area A) of the second power voltage line 150. In other words, the plurality of first sub-electrodes 160a need not be connected to each other.

In FIGS. 4B and 4C, only the first sub-electrodes 160a of the auxiliary electrode 160 may overlap the first power voltage line 140, thereby decreasing an overlapping area between the auxiliary electrode 160 and the first power voltage line 140, compared with the embodiment of FIG. 4A. Thus, the possibility of occurrence of a short circuit between the auxiliary electrode 160 and the first power voltage line 140 may decrease.

Figure 5A:
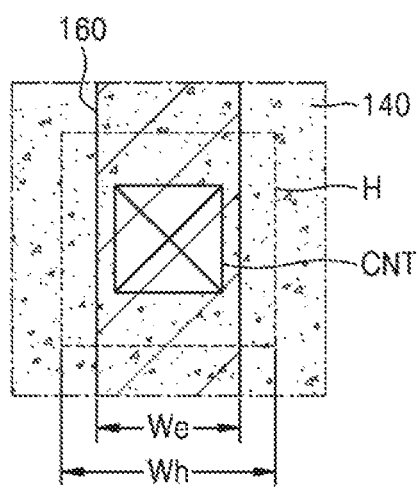
FIGS. 5A to 5C are plan views of various examples of a hole in a first power voltage line according to an exemplary embodiment.
Figure 5B:
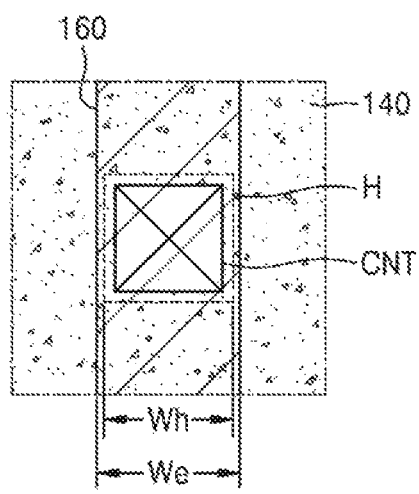
Figure 5C:
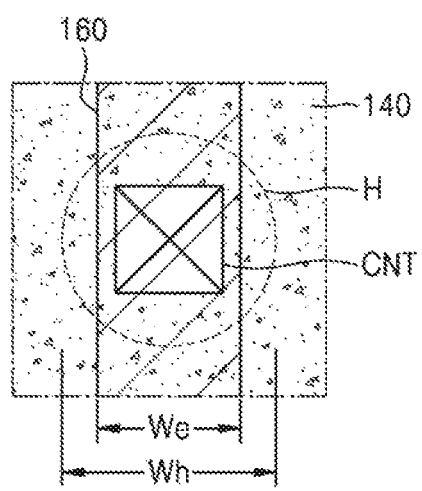

FIGS. 5A to 5C are plan views of various examples of the hole H in the first power voltage line 140 according to an exemplary embodiment. In FIGS. 5A to 5C, the first sub-electrodes 160a of the auxiliary electrode 160 overlaps the first power voltage line 140.

As illustrated in FIGS. 5A and 5B, the first power voltage line 140 may include the first hole H1 that has a quadrilateral shape. The present invention is not limited thereto. For example, the first power voltage line 140 may have the first hole H1 that has a circular shape, as shown in FIG. 5C. A width Wh of the first hole H1 may be greater than a width We of the first sub-electrodes 160a of the auxiliary electrode 160 as illustrated in FIGS. 5A and 5C. The present invention is not limited thereto. For example, a width Wh of the first hole H1 may be less than the width We of the first sub-electrodes 160a of the auxiliary electrode 160 as illustrated in FIG. 5B. The width Wh of the first hole H may be the largest value in a direction of the width We of the first sub-electrodes 160a of the auxiliary electrode 160. For example, in FIG. 5C, the width Wh of the hole H may be a value of a length across the center of the hole H, that is, a diameter of the hole H.

The present inventions is not limited to the above exemplary embodiments. For example, if a size of the hole H in the first power voltage line 140 is larger than a size of the opening OP in the insulation layer 106 (FIG. 3) or the contact portion CNT, the hole H of the first power voltage line 140 may have various shapes such as a circular shape, a polygonal shape, or the like.

Figure 6A:
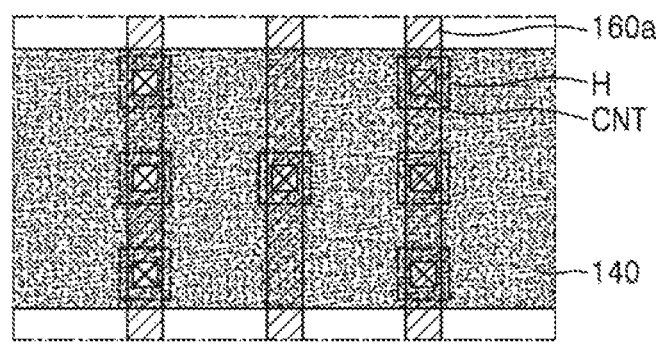
FIGS. 6A and 6B are plan views of various examples of a contact portion and a hole according to an exemplary embodiment.
Figure 6B:
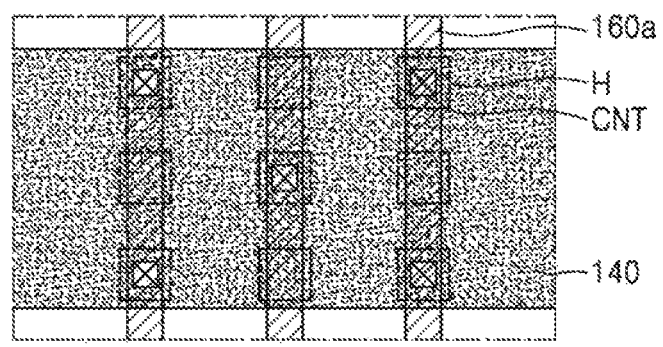

FIGS. 6A and 6B are plan views of various examples of the contact portion CNT and the hole H according to an exemplary embodiment. In FIGS. 6A and 6B, the first sub-electrodes 160a of the auxiliary electrode 160 overlaps the first power voltage line 140.

In FIGS. 4A to 4C, a plurality of openings OP (FIG. 3) is arranged so that each column of the plurality of openings OP has two openings OP. For example, each column of the plurality of opening OP may have the same number of openings. The plurality of openings OP of the insulation layer 106 may expose the first sub-electrodes 160a of the auxiliary electrode 160. Contact portions CNT may be formed on each of the first sub-electrodes 160a. Each of the contact portions CNT may overlap a corresponding opening OP. The same number of holes H in the first power voltage line 140 as that of the contact portions CNT may be formed in locations respectively corresponding to the openings OP or the contact portions CNT.

In an exemplary embodiment, as illustrated in FIGS. 6A and 6B, a non-uniform number of contact portions CNT may be formed in each of the first sub-electrodes 160a. For example, a column of the contact portions CNT may include three contact portions; another column of the contact portions CNT may include one contact portion. Two adjacent column of the contact portions CNT may have different number of contact holes CNT.

According to an exemplary embodiment, as illustrated in FIG. 6A, the contact portion CNT may be formed in various patterns, and for example, three contact portions CNT may be formed in each of the first sub-electrodes 160a on left and right sides, and one contact portion CNT may be formed in the first sub-electrode 160a in the middle. The same number of holes H in the first power voltage line 140 as that of the contact portions CNT may be formed in locations respectively corresponding to the contact portions CNT.

According to an exemplary embodiment, as illustrated in FIG. 6B, the contact portion CNT may be formed in various patterns, and for example, two contact portions CNT may be formed in each of the first sub-electrodes 160a on left and right sides, and one contact portion CNT may be formed in the first sub-electrode 160a in the middle. Holes H in the first power voltage line 140 may be formed not only in locations respectively corresponding to the contact portions CNT but also in a location corresponding to a portion of the first sub-electrodes 160a in which the contact portion CNT is not formed.

In an exemplary embodiment, the number and size of the holes H in the first power voltage line 140 may be determined by a predetermined sheet resistance of the first power voltage line 140. In an exemplary embodiment, the entire area of the auxiliary electrode 160 and a width of the first sub-electrodes 160a of the auxiliary electrode 160 may be determined by a predetermined sheet resistance of the auxiliary electrode 160.

FIG. 7 is a partial cross-sectional view taken along line I-I' of FIG. 1, according to an exemplary embodiment.

The exemplary embodiment of FIG. 7 is different from the exemplary embodiment of FIG. 3 in that the second interlayer insulation layer 103 is eliminated, and both of the fanout lines FL1 and FL2 are on the gate insulation layer 102, and the other configurations are the same.

Figure 8:
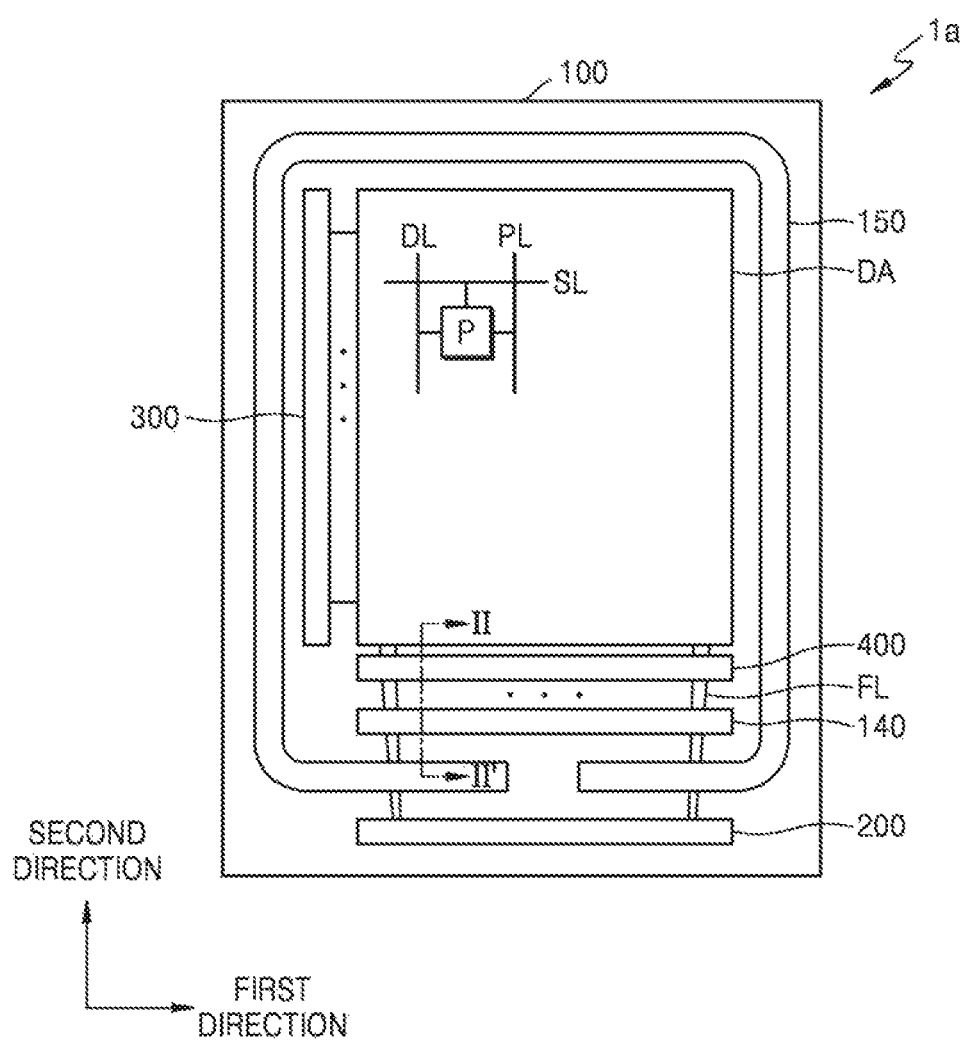
FIG. 8 is a schematic plan view of a display apparatus according to an exemplary embodiment.
Figure 9:
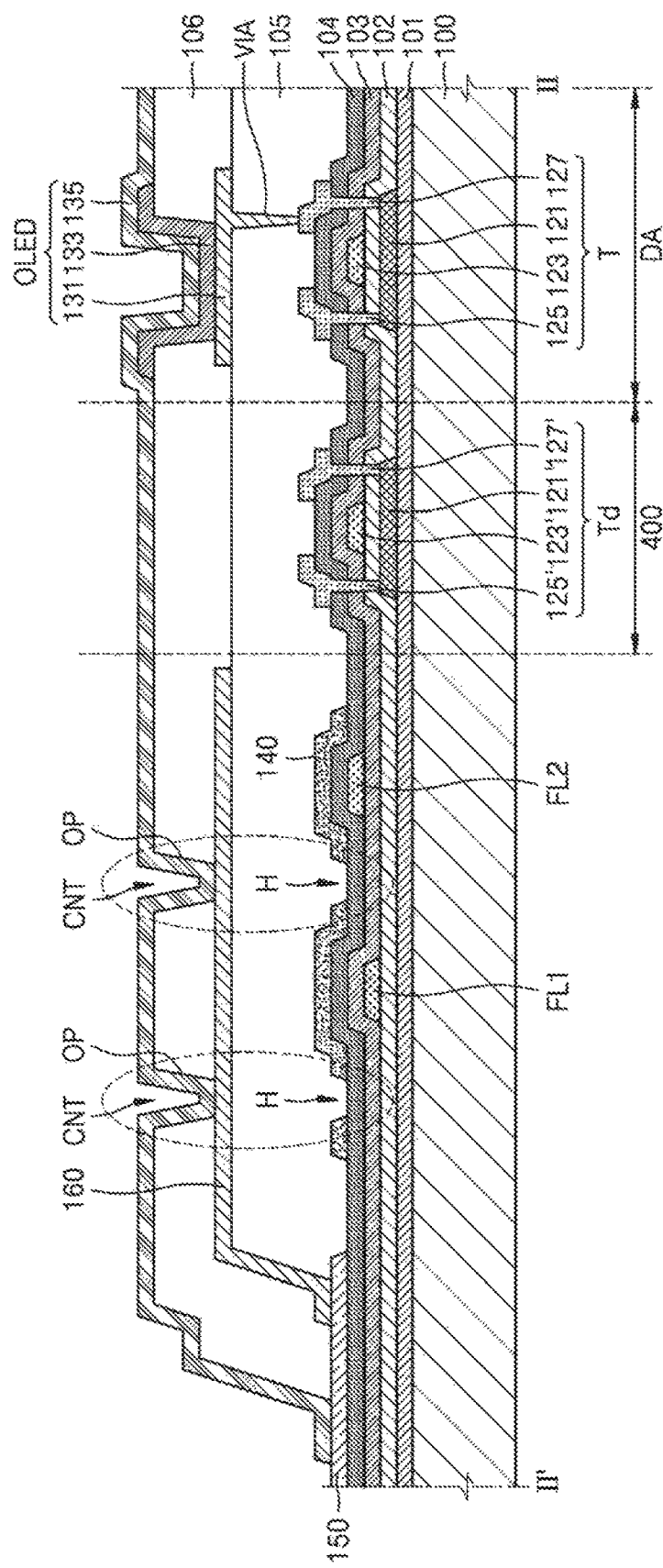
FIG. 9 is a partial cross-sectional taken along line II-II' of FIG. 8.

FIG. 8 is a schematic plan view of a display apparatus 1a according to an exemplary embodiment. FIG. 9 is a partial cross-sectional taken along line II-II' of FIG. 8.

The display apparatus 1a further includes a third driver 400 between the display area DA and the first driver 200, compared with the display apparatus 1 of FIG. 1. The third driver 400 may be a driving circuit composed of a plurality of demultiplexers including a plurality of circuit devices such as transistors. The demultiplexer of the third driver 400 has one end connected to one or more data lines DL of the display area DA and the other end connected to one fanout line FL. The third driver 400 sends data signals from the first driver 200 to data lines via the demultiplexers. Fanout lines FL fewer than the data lines may formed by using the demultiplexers of the third driver 400, and thus, the number of fanout lines FL may decrease. Accordingly, the number of integrated circuits included in the first driver 200 may decrease, thereby reducing manufacturing costs.

The first power voltage line 140 and the second power voltage line 150 may be between the third driver 400 and the first driver 200. The first power voltage line 140 may be close to the third driver 400, and the second power voltage line 150 may be close to the first driver 200.

Referring to FIG. 9 together, the third driver 400 may be between the display area DA and the first power voltage line 140. A transistor of the third driver 400 may be a thin film transistor Td that is formed using the same process as that of the thin film transistor T of the display area DA.

The thin film transistor Td may include an active layer 121' on the buffer layer 101, a gate electrode 123' on the gate insulation layer 102, and a source electrode 125' and a drain electrode 127' on the second interlayer insulation layer 103 and the first interlayer insulation layer 104.

FIG. 9 illustrates the first fanout line FL1 and the second fanout line FL2 that are on different layers from each other as in FIG. 3. The present invention is not limited thereto. For example, the fanout lines FL1 and FL2 may be on the same layer as each other, as shown in FIG. 7.

Since the other elements illustrated in FIGS. 8 and 9 are the same as those in the above exemplary embodiments, repeated descriptions thereof will be omitted.

The thin film transistor of the above exemplary embodiments is a top-gate type thin film transistor. The present invention is not limited thereto. For example, the thin film transistor may be a bottom-gate type thin film transistor. In an exemplary embodiment, the gate electrode may be the second interlayer insulation layer 103.

In an exemplary embodiment, the hole H is formed in the first power voltage line 140 that overlaps the auxiliary electrode 160 outside the display area DA. The present invention is not limited thereto. For example, a hole may be formed in a conductive line that is disposed on a lower layer of the auxiliary electrode 160 to overlap the auxiliary electrode 160, and the auxiliary electrode 160 may be formed as a bridge electrode.

According to an exemplary embodiment, an overlapping area between an upper conductive layer and a lower conductive layer that overlap each other at the outside of a display area may decrease, and thus, the occurrence of a short circuit may decrease.

While the present invention has been shown and described with reference to exemplary embodiments thereof, it will be apparent to those of ordinary skill in the art that various changes in form and detail may be made therein without departing from the spirit and scope of the present invention as defined by the following claims.

What is claimed is:

1. A display apparatus, comprising:
    a display area including an organic light-emitting diode (OLED);
    a first driver;
    a second driver;
    a plurality of fanout lines connecting the first driver to the display area;
    a first conductive line;
    a second conductive line;
    a first connection line connected to a first region of the first conductive line; and
    a second connection line connected to a second region of the first conductive line, the first connection line and an electrode of the OLED,
    wherein the plurality of fanout lines, the second conductive line, the first connection line and the second connection line overlap each other.

2. The display apparatus of claim 1,
    wherein the first connection line is interposed between the second connection line and the second conductive line, and
    wherein the second conductive line is interposed between the first connection line and the plurality of fanout lines.

3. The display apparatus of claim 1, further comprising:
    a passivation layer (105) interposed between the first connection line and the second conductive line; and
    an insulation layer (106) interposed between the second connection line and the first connection line.

4. The display apparatus of claim 3,
    wherein the insulation layer includes an opening exposing the first connection line,
    wherein the second connection line is connected to the first connection line via the opening of the insulation layer,
    wherein the second conductive line includes a plurality of holes penetrating the second conductive line, and
    wherein the opening of the insulation layer overlaps one of the plurality of the holes of the second conductive line.

5. The display apparatus of claim 4,
    wherein each of the plurality of the holes of the second conductive line is non-overlapped with each of the plurality of the fanout lines.

6. The display apparatus of claim 1,
    wherein each of the plurality of fanout lines is positioned at different heights from each other.

7. The display apparatus of claim 1,
    wherein each of the plurality of fanout lines is positioned on different layers.

* * * * *